(12) United States Patent
Kuo et al.

(10) Patent No.: US 10,374,038 B2
(45) Date of Patent: Aug. 6, 2019

(54) SEMICONDUCTOR DEVICE SOURCE/DRAIN REGION WITH ARSENIC-CONTAINING BARRIER REGION

(71) Applicant: Taiwan Semiconductor Manufacturing Co., Ltd., Hsinchu (TW)

(72) Inventors: Chien-I Kuo, Chiayi (TW); Chii-Horng Li, Zhubei (TW); Chia-Ling Chan, New Taipei (TW); Li-Li Su, ChuBei (TW); Yi-Fang Pai, Hsinchu (TW); Wei Te Chiang, Chiayi (TW); Shao-Fu Fu, Kaohsiung (TW); Wei Hao Lu, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/922,643

(22) Filed: Mar. 15, 2018

(65) Prior Publication Data
US 2019/0165100 A1    May 30, 2019

Related U.S. Application Data

(60) Provisional application No. 62/590,500, filed on Nov. 24, 2017.

(51) Int. Cl.
*H01L 21/8234* (2006.01)
*H01L 29/08* (2006.01)
(Continued)

(52) U.S. Cl.
CPC ...... *H01L 29/0847* (2013.01); *H01L 21/0262* (2013.01); *H01L 21/02532* (2013.01); *H01L 21/2236* (2013.01); *H01L 29/167* (2013.01); *H01L 29/36* (2013.01); *H01L 29/66636* (2013.01); *H01L 29/66795* (2013.01); *H01L 29/7851* (2013.01); *H01L 21/3065* (2013.01); *H01L 21/30604* (2013.01); *H01L 29/6656* (2013.01); *H01L 29/66545* (2013.01)

(58) Field of Classification Search
CPC ..... H01L 21/823418; H01L 21/823814; H01L 29/6656; H01L 29/66636; H01L 29/6664
See application file for complete search history.

(56) References Cited

U.S. PATENT DOCUMENTS 8,962,400 B2    2/2015    Tsai et al.
9,093,514 B2    7/2015    Tsai et al.
(Continued)

*Primary Examiner* — Hoai V Pham
(74) *Attorney, Agent, or Firm* — Slater Matsil, LLP

(57) ABSTRACT

The present disclosure relates generally to an epitaxy scheme for forming source/drain regions in a semiconductor device, such as an n-channel device. In an example, a method of manufacturing a semiconductor device includes forming an active area on a substrate. The active area includes a source/drain region. The formation of the source/drain region includes forming a barrier region along a bottom surface and side surface of a recess in the active area. The barrier region includes arsenic having a first dopant concentration. The formation of the source/drain region further includes forming an epitaxial material on the barrier region in the recess. The epitaxial material includes phosphorous having a second dopant concentration.

20 Claims, 12 Drawing Sheets

(51) Int. Cl.
    *H01L 29/167*     (2006.01)
    *H01L 29/36*      (2006.01)
    *H01L 21/223*     (2006.01)
    *H01L 21/02*      (2006.01)
    *H01L 29/78*      (2006.01)
    *H01L 29/66*      (2006.01)
    H01L 21/3065     (2006.01)
    H01L 21/306      (2006.01)

(56) References Cited

U.S. PATENT DOCUMENTS

| | | |
|---|---|---|
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,576,814 B2 | 2/2017 | Wu et al. |
| 9,608,116 B2 | 3/2017 | Ching et al. |
| 9,812,363 B1 | 11/2017 | Liao et al. |
| 9,859,380 B2 | 1/2018 | Lee et al. |
| 2007/0075378 A1* | 4/2007 | Lin .................... H01L 29/1054 257/383 |

\* cited by examiner

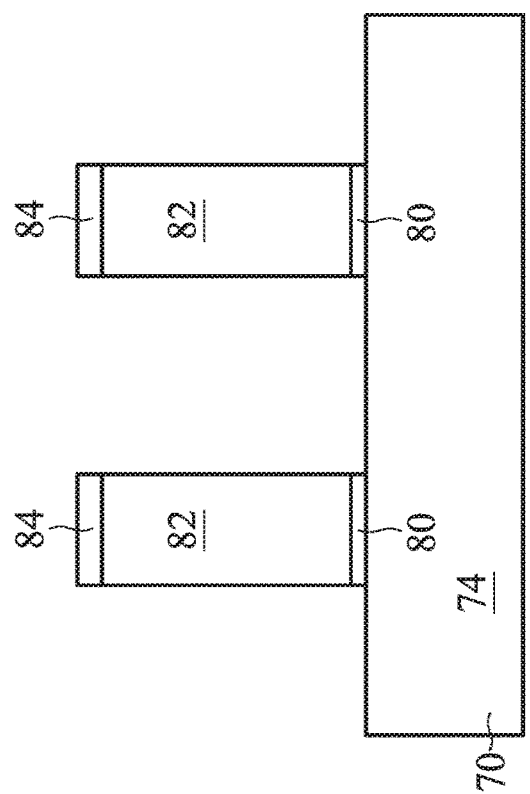
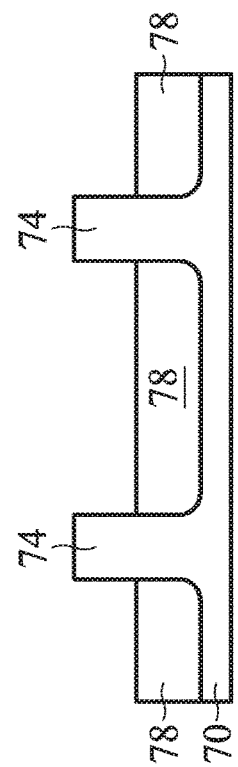
FIG. 1A
FIG. 1B

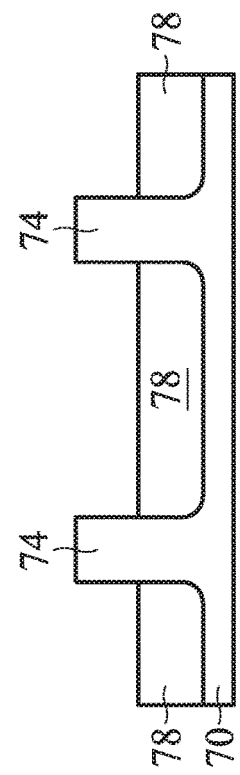
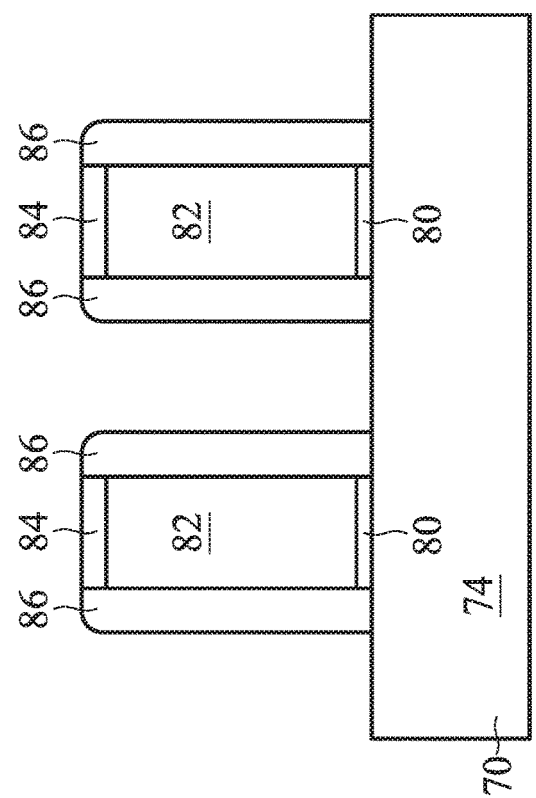
FIG. 2A
FIG. 2B

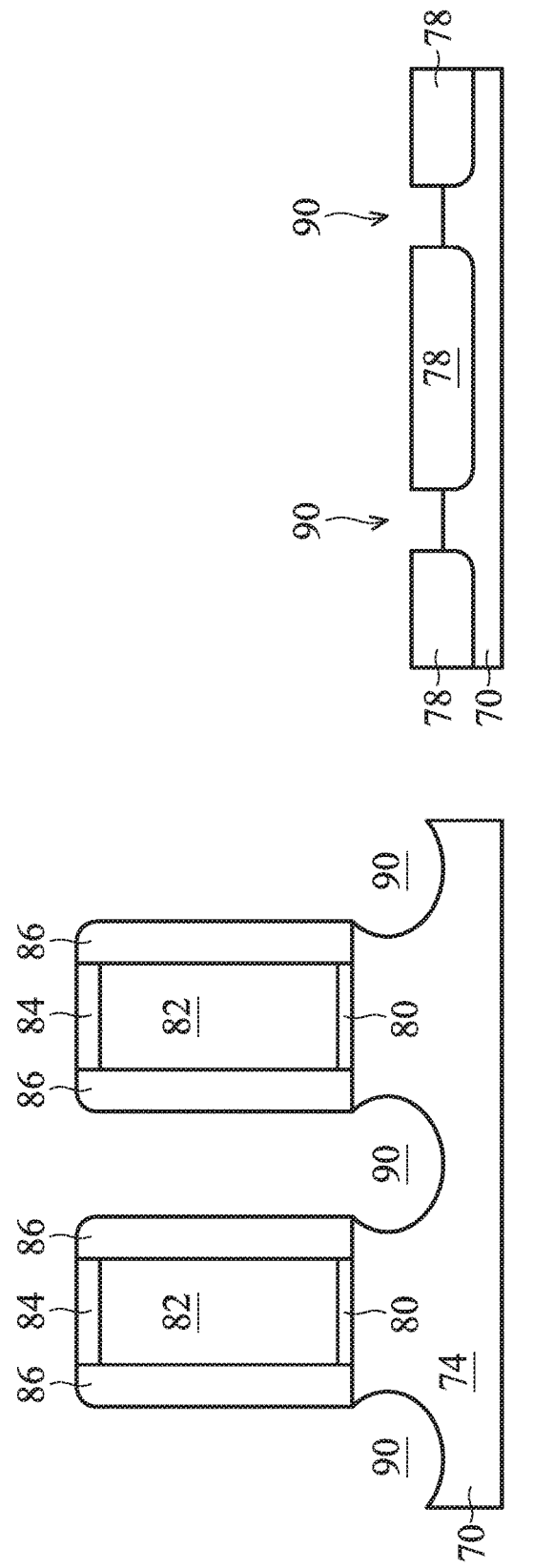

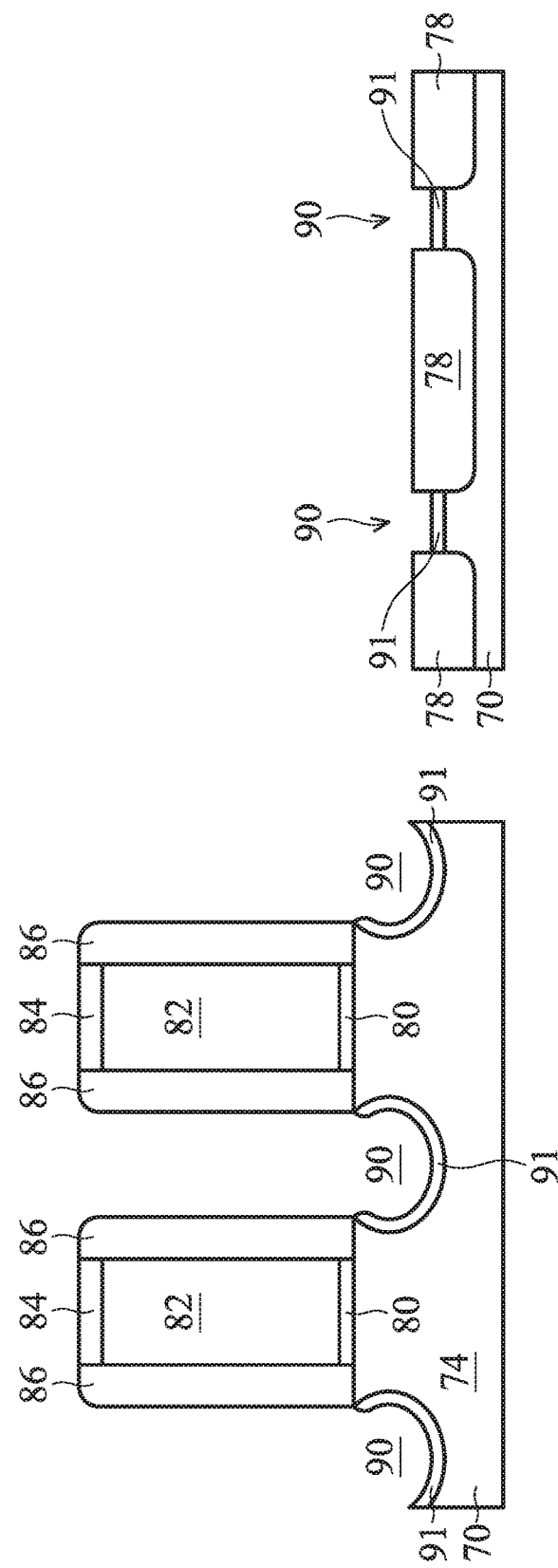

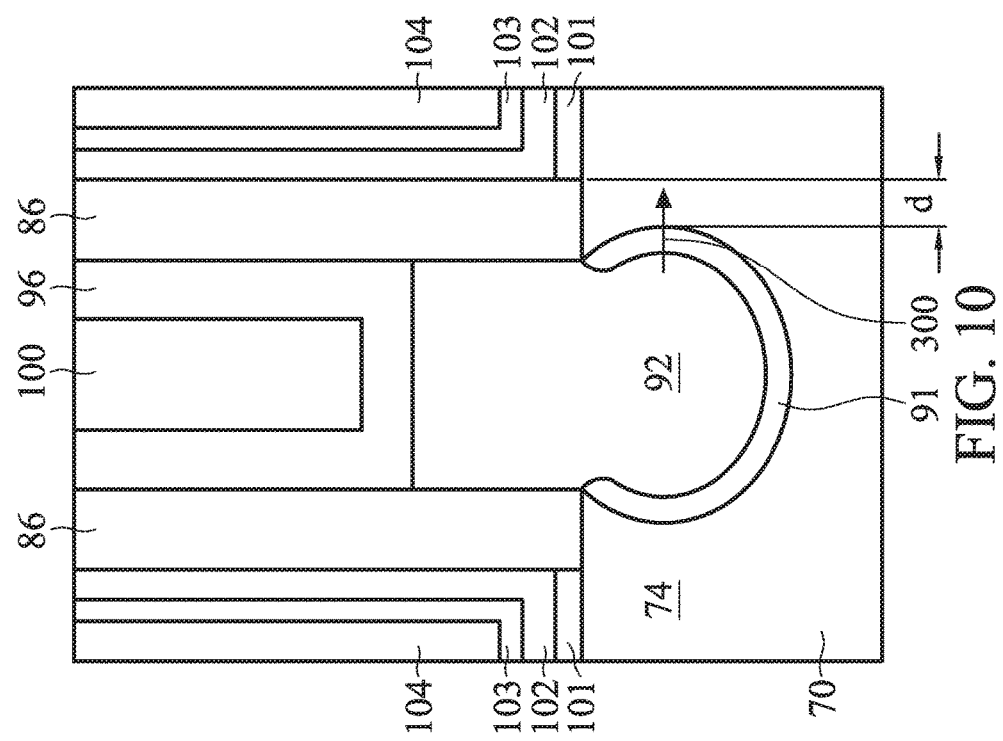

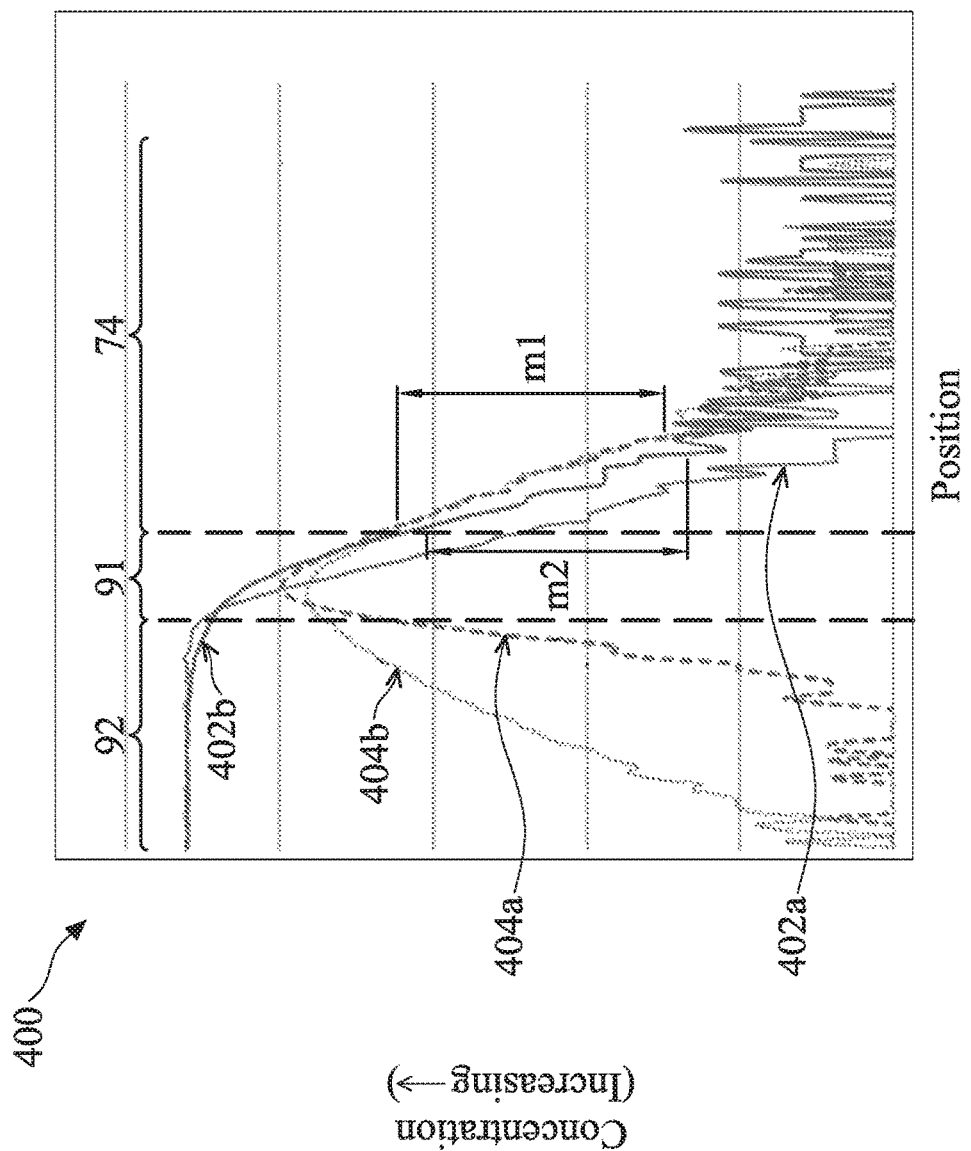

US 10,374,038 B2

SEMICONDUCTOR DEVICE SOURCE/DRAIN REGION WITH ARSENIC-CONTAINING BARRIER REGION

CROSS-REFERENCE TO RELATED APPLICATION & PRIORITY CLAIM

This application claims the benefit of and priority to U.S. Provisional Patent Application Ser. No. 62/590,500, filed Nov. 24, 2017, which is herein incorporated by reference in its entirety for all applicable purposes.

BACKGROUND

Semiconductor devices are used in a variety of electronic applications, such as personal computers, cell phones, digital cameras, and other electronic equipment. As the semiconductor industry has progressed into nanometer technology process nodes in pursuit of higher device density, higher performance, low power consumption, and lower costs, challenges from both fabrication and design issues have resulted in the development of three-dimensional designs, such as a Fin Field Effect Transistor (FinFET). FinFET devices typically include semiconductor fins in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. However, with the decrease in scaling, new challenges are presented to IC fabrication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-C, 2A-B, 3A-B, 4A-B, 5A-B, 6A-B, 7A-B, and 8A-B are various views of respective intermediate structures at manufacturing stages in an example process of forming a semiconductor device, such as Fin Field-Effect Transistors (FinFETs), in accordance with some embodiments.

FIG. 10 is a cross-sectional view of a portion of the intermediate structure of FIG. 7A to illustrate further details in accordance with some embodiments.

FIG. 11 is a graph illustrating various dopant profiles along a reference direction in FIG. 10 in accordance with some embodiments.

DETAILED DESCRIPTION

Figure 1C:
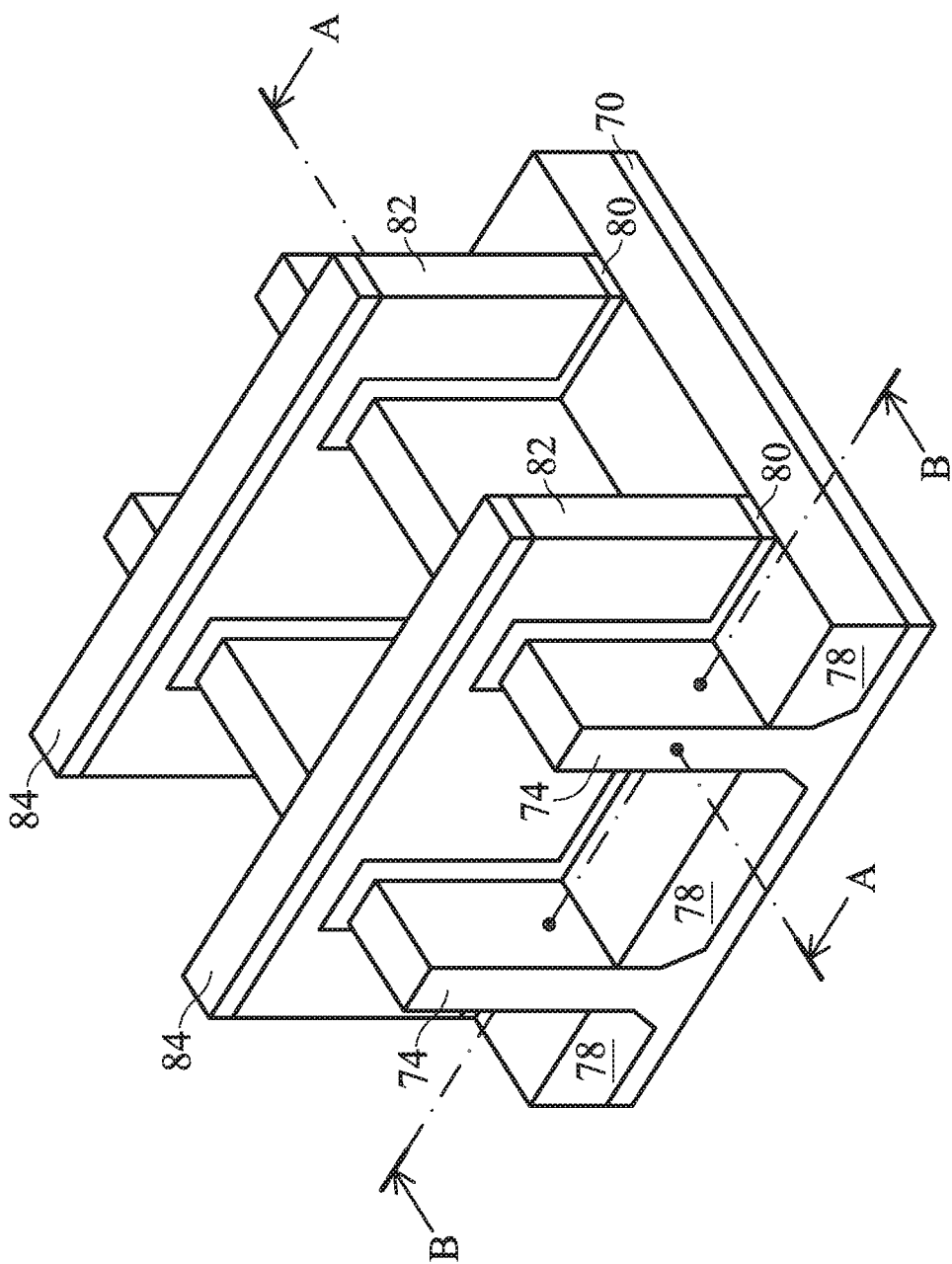

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Aspects of the present disclosure relate to an epitaxial scheme for a source/drain region in a semiconductor device, such as an n-type Field Effect Transistor (nFET) device, which may be a Fin Field Effect Transistor (FinFET) device. Source/drain regions of transistors, for example, and methods for forming such features are described. Techniques and apparatus are provided herein for forming source/drain regions in a semiconductor substrate using a barrier region that includes arsenic (e.g., SiAs or Si:As), which may achieve lower Drain Induced Barrier Lowering (DIBL) and to improve transistor current.

Example techniques for forming the source/drain regions are described and illustrated herein with respect to Fin Field-Effect Transistors (FinFETs); however, an epitaxy scheme within the scope of this disclosure may also be implemented in planar transistors and/or other semiconductor devices. Further, intermediate stages of forming FinFETs are illustrated. Some aspects described herein are described in the context of FinFETs formed using a replacement gate process. In other examples, a gate-first process may be used, as a person of ordinary skill in the art will readily understand. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps described herein.

FIGS. 1A-C through 8A-B are views of respective intermediate structures at manufacturing stages in an example process of forming FinFETs in accordance with some embodiments. FIG. 9 is a flow chart illustrating example operations of the example process in accordance with some embodiments.

FIGS. 1A and 1B illustrates respective cross-sectional views of the intermediate structure, and FIG. 1C illustrates a perspective view of the intermediate structure. FIG. 1C illustrates reference cross-sections A-A and B-B that are references for cross-section views. Figures ending with an "A" designation illustrate cross-section views along cross-section A-A in FIG. 1C, and figures ending with a "B" designation illustrate cross-sectional views along cross-section B-B in FIG. 1C.

The intermediate structure of FIGS. 1A-C includes first and second fins 74 formed on a semiconductor substrate 70, with respective isolation regions 78 on the semiconductor substrate 70 between neighboring fins 74. First and second dummy gate stacks are along respective sidewalls of and over the fins 74. The first and second dummy gate stacks each include an interfacial dielectric 80, a dummy gate 82, and a mask 84.

The semiconductor substrate 70 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 70 may include an elemental semiconductor such as silicon (Si) or germanium (Ge); a compound semiconductor; an alloy semiconductor; or a combination thereof.

The fins 74 are formed in the semiconductor substrate 70. For example, the semiconductor substrate 70 may be etched such that trenches are formed between neighboring pairs of fins 74 and such that the fins 74 protrude from the semiconductor substrate 70 using appropriate photolithography and etch processes. Isolation regions 78 are formed with each being in a corresponding trench. The isolation regions 78 may include or be an insulating material such as an oxide (such as silicon oxide), a nitride, the like, or a combination thereof, and the insulating material may be deposited using an appropriate deposition process. The insulating material may be recessed after being deposited to form the isolation regions 78. The insulating material is recessed such that the fins 74 protrude from between neighboring isolation regions 78, which may, at least in part, thereby delineate the fins 74 as active areas on the semiconductor substrate 70. A person having ordinary skill in the art will readily understand that the processes described above are just examples of how fins 74 may be formed. In other examples, the fins 74 may be formed by other processes and may include heteroepitaxial and/or homoepitaxial structures.

The dummy gate stacks are formed on the fins 74. In a replacement gate process as described herein, the interfacial dielectrics 80, dummy gates 82, and masks 84 for the dummy gate stacks may be formed by sequentially forming respective layers by appropriate processes, and then patterning those layers into the dummy gate stacks by appropriate photolithography and etching processes. For example, the interfacial dielectrics 80 may include or be silicon oxide, silicon nitride, the like, or multilayers thereof. The dummy gates 82 may include or be silicon (e.g., polysilicon) or another material. The masks 84 may include or be silicon nitride, silicon oxynitride, silicon carbon nitride, the like, or a combination thereof.

Cross-section A-A in FIG. 1C is in a plane along, e.g., channels in one fin 74 between opposing source/drain regions. Cross-section B-B in FIG. 1C is in a plane perpendicular to cross-section A-A and is across respective source/drain regions in neighboring fins 74.

FIGS. 2A and 2B illustrate the formation of gate spacers 86. Gate spacers 86 are formed along sidewalls of the dummy gate stacks (e.g., sidewalls of the interfacial dielectric 80, dummy gate 82, and mask 84). The gate spacers 86 may be formed by conformally depositing one or more layers for the gate spacers 86 and anisotropically etching the one or more layers, for example. The one or more layers for the gate spacers 86 may include or be silicon nitride, silicon oxynitride, silicon carbon nitride, the like, multi-layers thereof, or a combination thereof.

FIGS. 3A and 3B illustrate the formation of recesses 90 in the fins 74 for source/drain regions proximate the dummy gate stacks, as further illustrated in operation 202 of FIG. 9. As illustrated, the recesses 90 are formed in the fins 74 on opposing sides of the dummy gate stacks. The recessing can be by an etch process. The etch process can be isotropic or anisotropic, or further, may be selective with respect to one or more crystalline planes of the semiconductor substrate 70. Hence, the recesses 90 can have various cross-sectional profiles based on the etch process implemented. The etch process may be a dry etch, such as a reactive ion etch (RIE), neutral beam etch (NBE), or the like, or a wet etch, such as using tetramethylammonium hydroxide (TMAH), ammonium hydroxide ($NH_4OH$), or another etchant.

FIGS. 4A and 4B illustrate the formation of barrier regions 91 along surfaces of the fins 74 defined by the recesses 90, as further illustrated in operation 204 of FIG. 9. In some examples, the barrier regions 91 are formed by epitaxially growing a material comprising a barrier species on the surfaces of the recesses 90, as further illustrated in operation 206 of FIG. 9. In other examples, the barrier regions 91 are formed by doping the fins 74 along and through the surfaces of the recesses 90 with the barrier species, as further illustrated in operation 208 of FIG. 9. As described in more detail subsequently, the barrier regions 91 can prevent out-diffusion of conductivity dopant species from a source/drain region formed on the respective barrier regions 91. Generally, the barrier regions 91 include a barrier species that can prevent out-diffusion, and in some examples described herein, the barrier species includes arsenic, although other elements or materials may be implemented.

In some examples, the barrier regions 91 are formed by epitaxially growing the barrier regions 91 in the recesses 90. In some examples, the barrier regions 91 may be epitaxially grown on the bottom and side surfaces of the recesses 90. In such examples, the barrier regions 91 can comprise a semiconductor material and the barrier species. The barrier regions 91 may be epitaxially grown by reduced pressure chemical vapor deposition (RPCVD), low pressure CVD (LPCVD), metal-organic CVD (MOCVD), molecular beam epitaxy (MBE), liquid phase epitaxy (LPE), vapor phase epitaxy (VPE), the like, or a combination thereof. In some examples where the barrier species is arsenic, the barrier region 91 may be an epitaxially grown SiAs layer. To form the SiAs layer, an RPCVD process can be implemented. A silicon source precursor gas of the RPCVD can include silane ($SiH_4$), disilane ($Si_2H_6$), trisilane ($Si_3H_8$), dichlorosilane ($SiH_2Cl_2$), trichlorosilane (TCS), another silicon-containing precursor, and/or any combination thereof, and an arsenic source precursor gas of the RPCVD can include arsine ($AsH_3$), another arsenic-containing precursor, and/or any combination thereof. Other gases, such as carrier gases like nitrogen ($N_2$), hydrogen ($H_2$), or the like, can be mixed with the precursors. A flow rate of the silicon source precursor can be in a range from about 500 sccm to about 1000 sccm, and a flow rate of the arsenic source precursor can be in a range from about 50 sccm to about 300 sccm. A pressure of the RPCVD can be in a range from about 50 Torr to about 500 Torr. A temperature of the RPCVD can be in a range from about 600° C. to about 800° C. In some examples, these parameters can vary based on the process being performed. The RPCVD process can be implemented in a cyclic deposition-etch process, as a person having ordinary skill in the art will readily understand. Further, a person having ordinary skill in the art will readily understand different processes that may be implemented to achieve a barrier region 91 of epitaxially grown SiAs or another material including a different barrier species.

In other examples, the barrier regions 91 may be formed by doping the fins 74 through the surfaces of the recesses 90 with the barrier species. The barrier region 91 may be formed by plasma doping (PLAD) and/or by implanting the barrier species through the surfaces of the recesses 90. In some examples where the barrier species is arsenic, the barrier region 91 may be an arsenic doped silicon (Si:As) region in the fin 74 (such as where the fin 74 is silicon) formed by plasma doping the recesses 90 with As (e.g., As-PLAD). A person having ordinary skill in the art will readily understand different processes that may be implemented to achieve a barrier region 91 of arsenic doped silicon (Si:As) or another material including a different barrier species.

In some examples, the barrier region 91 can have a thickness equal to or less than about 20 nm, such as equal to or less than about 5 nm. The thickness can be substantially conformal or uniform along the surfaces of the recesses 90. The thickness can be measured from the surface of the respective recess 90 through an epitaxially grown barrier region 91 when the barrier region 91 is epitaxially grown, and/or the thickness can be measured from the surface of the respective recess 90 into the fin 74 through a plasma-doped barrier region 91 when the barrier region 91 is formed by doping the fin 74.

The barrier region 91 can have various concentrations of the barrier species. When arsenic is implemented as the barrier species, a concentration of arsenic in the barrier region 91 may be equal to or greater than about $10^{18}$ cm$^{-3}$, such as in a range from about $1 \times 10^{20}$ cm$^{-3}$ to about $2 \times 10^{21}$ cm$^{-3}$. Additional details of the barrier region 91 are described below, particularly in the context of the barrier species being arsenic.

Figure 5A:
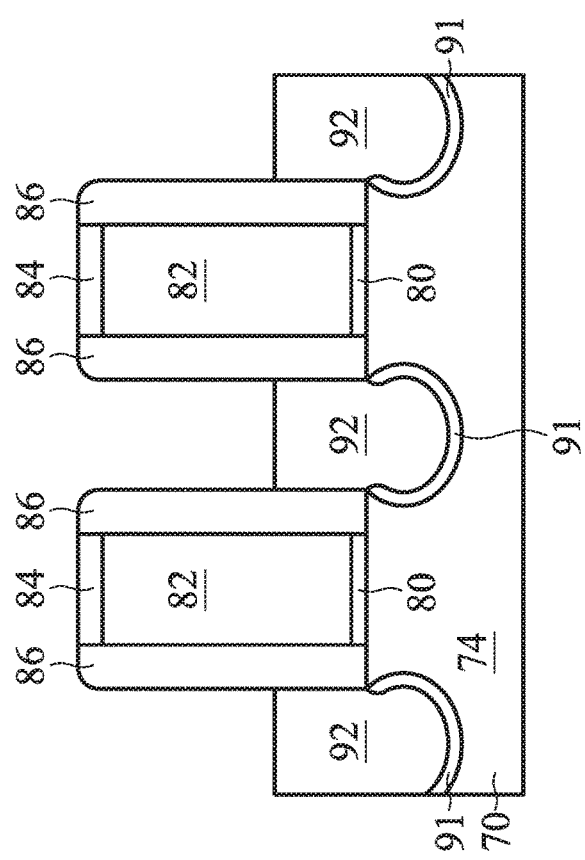
Figure 5B:
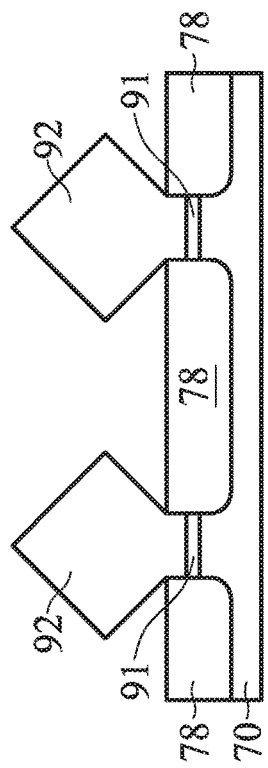

FIGS. 5A and 5B illustrate the formation of epitaxy source/drain regions 92 on the barrier regions 91 and in the recesses 90, as further illustrated in operation 210 of FIG. 9. Although as described as separate components, a barrier region 91 and corresponding epitaxy source/drain region 92 can function together as a source/drain region. Generally, the epitaxy source/drain regions 92 include a semiconductor that includes a conductivity dopant species. The barrier regions 91 (with the barrier species) can reduce or prevent the conductivity dopant species of the epitaxy source/drain regions 92 from out-diffusing into the fins 74 (e.g., from out-diffusing into the channel regions in the fins 74).

The epitaxy source/drain regions 92 may be formed by epitaxially growing the epitaxy source/drain regions 92 on the barrier region 91 and in the recess 90. The epitaxy source/drain regions 92 can be doped with the conductivity dopant species (e.g., an n-type dopant) by in situ doping during the epitaxial growth and/or by implantation after the epitaxial growth. In some examples, the epitaxy source/drain regions 92 can include silicon phosphorous, silicon phosphorous carbide, or the like, wherein the epitaxy source/drain regions 92 are in situ doped with the conductivity dopant species (e.g., phosphorous). In other examples, the epitaxy source/drain regions 92 can include silicon, silicon carbide, a II-VI compound semiconductor, a III-V compound semiconductor, or the like, and the epitaxy source/drain regions 92 are subsequently implanted with the conductivity dopant species (e.g., phosphorous). The epitaxial growth may be by RPCVD, LPCVD, MOCVD, MBE, LPE, VPE, the like, or a combination thereof.

In some examples where the conductivity dopant species is phosphorous and the epitaxy source/drain regions 92 are silicon phosphorous, the epitaxy source/drain regions 92 may be an epitaxially grown SiP region. To form the SiP region, an RPCVD process can be implemented. A silicon source precursor gas of the RPCVD can include silane (SiH$_4$), disilane (Si$_2$H$_6$), trisilane (Si$_3$H$_8$), dichlorosilane (SiH$_2$Cl$_2$), trichlorosilane, another silicon-containing precursor, and/or any combination thereof, and a phosphorous source precursor gas of the RPCVD can include phosphine (PH$_3$), another phosphorous-containing precursor, and/or any combination thereof. Other gases, such as carrier gases like nitrogen (N$_2$), hydrogen (H$_2$), or the like, can be mixed with the precursors. A flow rate of the silicon source precursor can be in a range from about 600 sccm to about 900 sccm, and a flow rate of the phosphorous source precursor can be in a range from about 150 sccm to about 300 sccm. A pressure of the RPCVD can be in a range from about 50 Torr to about 300 Torr. A temperature of the RPCVD can be in a range from about 600° C. to about 750° C. In some examples, the parameters may vary based on the process. The RPCVD process can be implemented in a cyclic deposition-etch process, as a person having ordinary skill in the art will readily understand. Further, a person having ordinary skill in the art will readily understand different processes that may be implemented to achieve an epitaxy source/drain regions 92 of epitaxially grown SiP or another material including a different conductivity dopant species.

In some cases, due to blocking by the isolation regions 78, epitaxially grown material of the epitaxy source/drain regions 92 may be first grown vertically in recesses 90, during which time the epitaxially grown material of the epitaxy source/drain regions 92 does not grow horizontally. After the recesses 90 are fully filled, the epitaxially grown material may grow both vertically and horizontally to form facets, which may correspond to crystalline planes of the semiconductor substrate 70.

The epitaxy source/drain regions 92 can have various concentrations of the conductivity dopant species. When phosphorous is implemented as the conductivity dopant species, e.g., from epitaxial growth with phosphorous and/or by implanting phosphorous, a concentration of phosphorous in the epitaxy source/drain regions 92 can be in a range from about $10^{19}$ cm$^{-3}$ to about $5 \times 10^{21}$ cm$^{-3}$, such as in a range from $2 \times 10^{21}$ cm$^{-3}$ to about $5 \times 10^{21}$ cm$^{-3}$. Additional details of the epitaxy source/drain regions 92 are described below, particularly in the context of the conductivity dopant species being phosphorous.

Figure 6A:
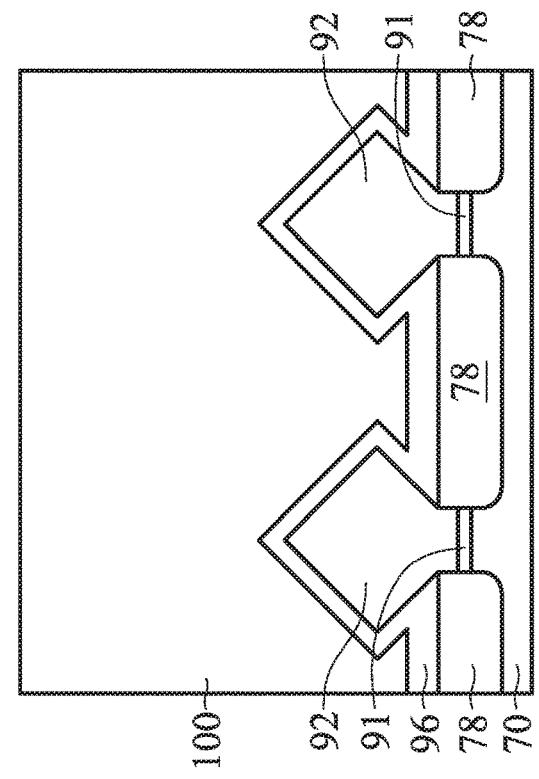
Figure 6B:
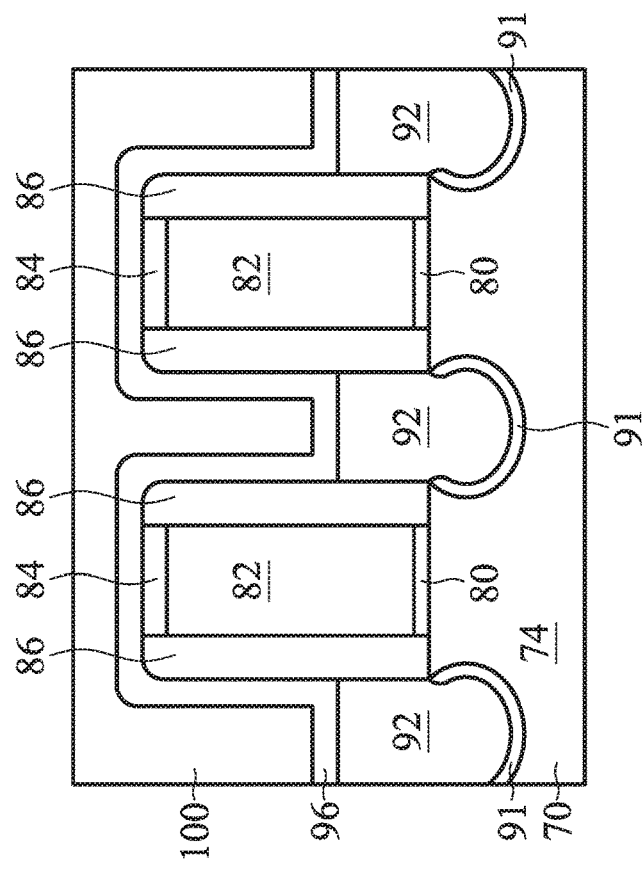

FIGS. 6A and 6B illustrate the formation of a contact etch stop layer (CESL) 96 and a first interlayer dielectric (ILD) 100. Generally, an etch stop layer can provide a mechanism to stop an etching process when forming, e.g., contacts or vias. An etch stop layer may be formed of a dielectric material having a different etch selectivity from adjacent layers, for example, the first ILD 100. The CESL 96 is conformally deposited over the epitaxy source/drain regions 92, dummy gate stacks, gate spacers 86, and isolation regions 78, and the first ILD 100 is deposited over the CESL 96. The etch stop layer may comprise or be silicon nitride, silicon carbon nitride, silicon carbon oxide, carbon nitride, the like, or a combination thereof. The first ILD 100 may comprise or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), SiO$_x$C$_y$, Spin-On-Glass, Spin-On-Polymers, silicon carbon material, a compound thereof, a composite thereof, the like, or a combination thereof. The CESL 96 and first ILD 100 can be deposited by any appropriate deposition technique.

Figure 7A:
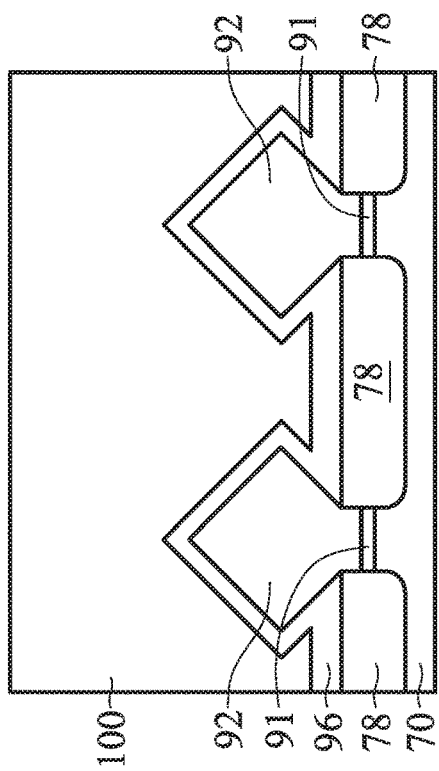
Figure 7B:
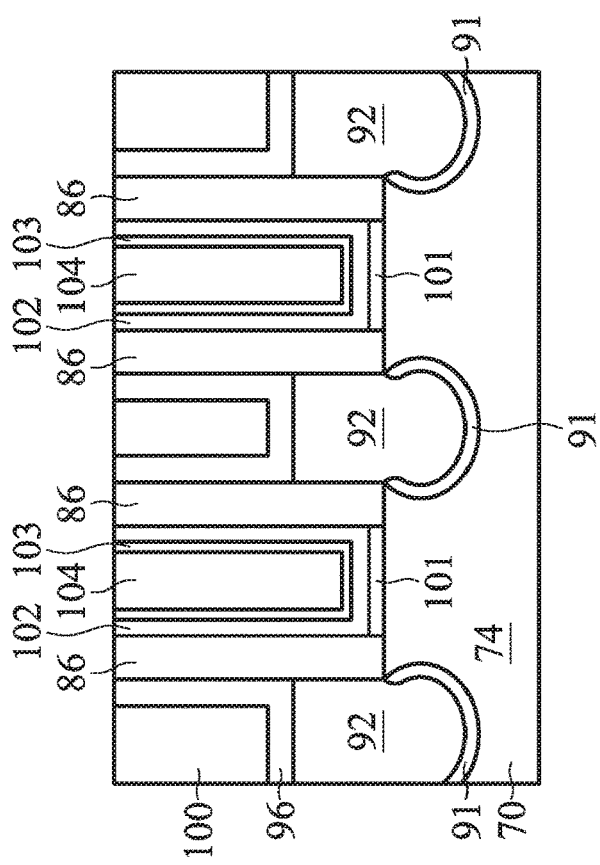

FIGS. 7A and 7B illustrate the replacement of the dummy gate stacks with replacement gate structures. A planarization process, such as a chemical mechanical planarization (CMP), is performed to level the top surface of the CESL 96 and first ILD 100 with the top surfaces of the dummy gates 82. The CMP may also remove the masks 84 (and, in some instances, upper portions of the gate spacers 86) on the dummy gates 82. Accordingly, top surfaces of the dummy gates 82 are exposed through the CESL 96 and first ILD 100. The dummy gates 82 and interfacial dielectrics 80 are then removed, such as by one or more etch processes, to expose respective channel regions in the fins 74.

Layers for forming the replacement gate structures can then be deposited where the dummy gate stacks were removed, such as by conformal deposition for some layers, and excess portions of those layers can be removed by a planarization process, such as a CMP, to form the replacement gate structures. The replacement gate structures each include, as illustrated in FIG. 7A, an interfacial dielectric 101, a gate dielectric layer 102, one or more optional conformal layers 103, and a gate conductive fill material 104.

The interfacial dielectric 101 is formed on sidewalls and top surfaces of the fins 74 along the channel regions where dummy gate stacks were removed. The interfacial dielectric 101 can be, for example, the interfacial dielectric 80 if not removed, an oxide (e.g., silicon oxide), nitride (e.g., silicon nitride), and/or another dielectric layer. A gate dielectric layer 102 is conformally deposited on the interfacial dielectric 101, along sidewalls of the gate spacers 86, and over the top surface of the CESL 96 and first ILD 100. The gate dielectric layer 102 can be or include silicon oxide, silicon nitride, a high-k dielectric material, multilayers thereof, or other dielectric material. A high-k dielectric material may have a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof.

Then, the one or more optional conformal layers 103 can be conformally (and sequentially, if more than one) deposited on the gate dielectric layer 102. The one or more optional conformal layers 103 can include one or more barrier and/or capping layers and one or more work-function tuning layers. The one or more barrier and/or capping layers can include a nitride, silicon nitride, carbon nitride, and/or aluminum nitride of tantalum and/or titanium; a nitride, carbon nitride, and/or carbide of tungsten; the like; or a combination thereof. The one or more work-function tuning layer may include or be a nitride, silicon nitride, carbon nitride, aluminum nitride, aluminum oxide, and/or aluminum carbide of titanium and/or tantalum; a nitride, carbon nitride, and/or carbide of tungsten; cobalt; platinum; the like; or a combination thereof.

The gate conductive fill material 104 is formed over the gate dielectric layer 102 and/or the one or more optional conformal layers 103 (if implemented). The gate conductive fill material 104 can fill remaining regions where the dummy gate stacks were removed. The gate conductive fill material 104 may be or comprise a metal-containing material such as tungsten (W), cobalt (Co), ruthenium (Ru), aluminum (Al), multi-layers thereof, or a combination thereof.

Figures 8A, 8B:
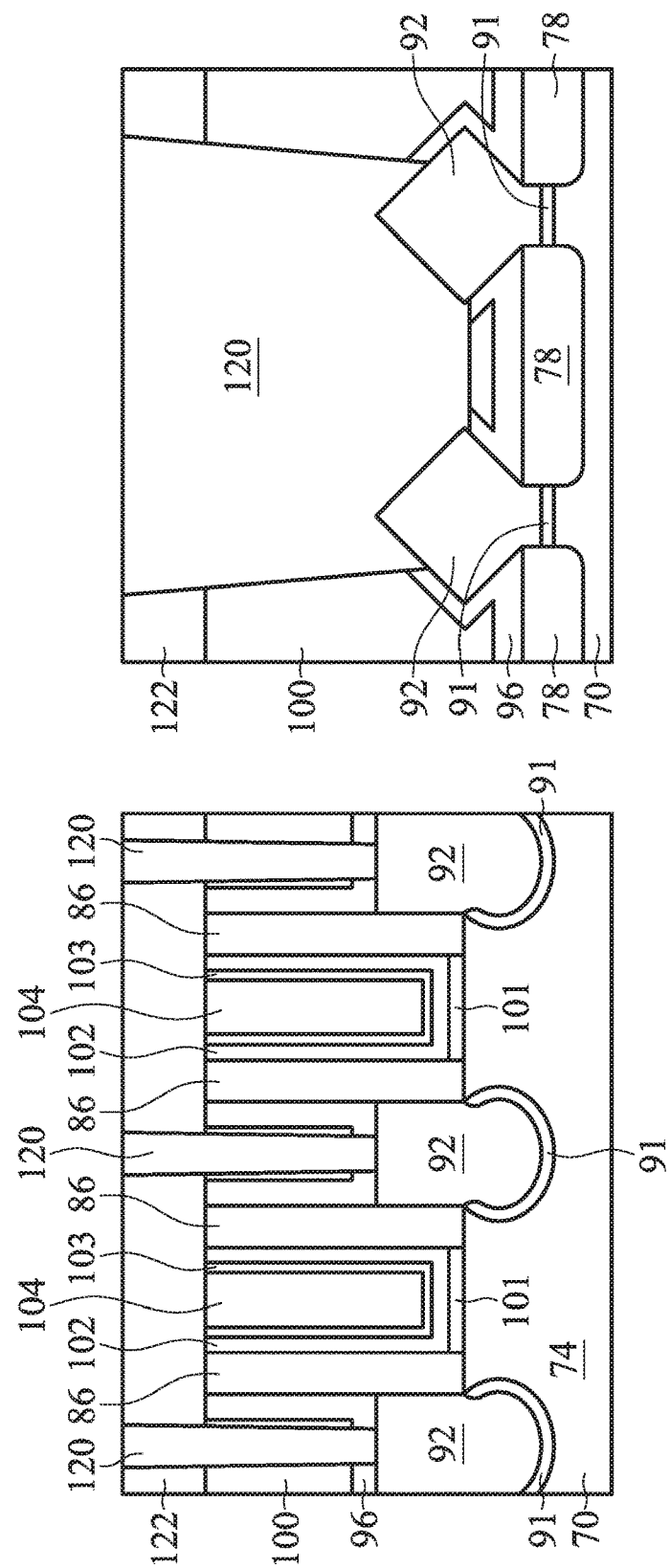
Figure 9:
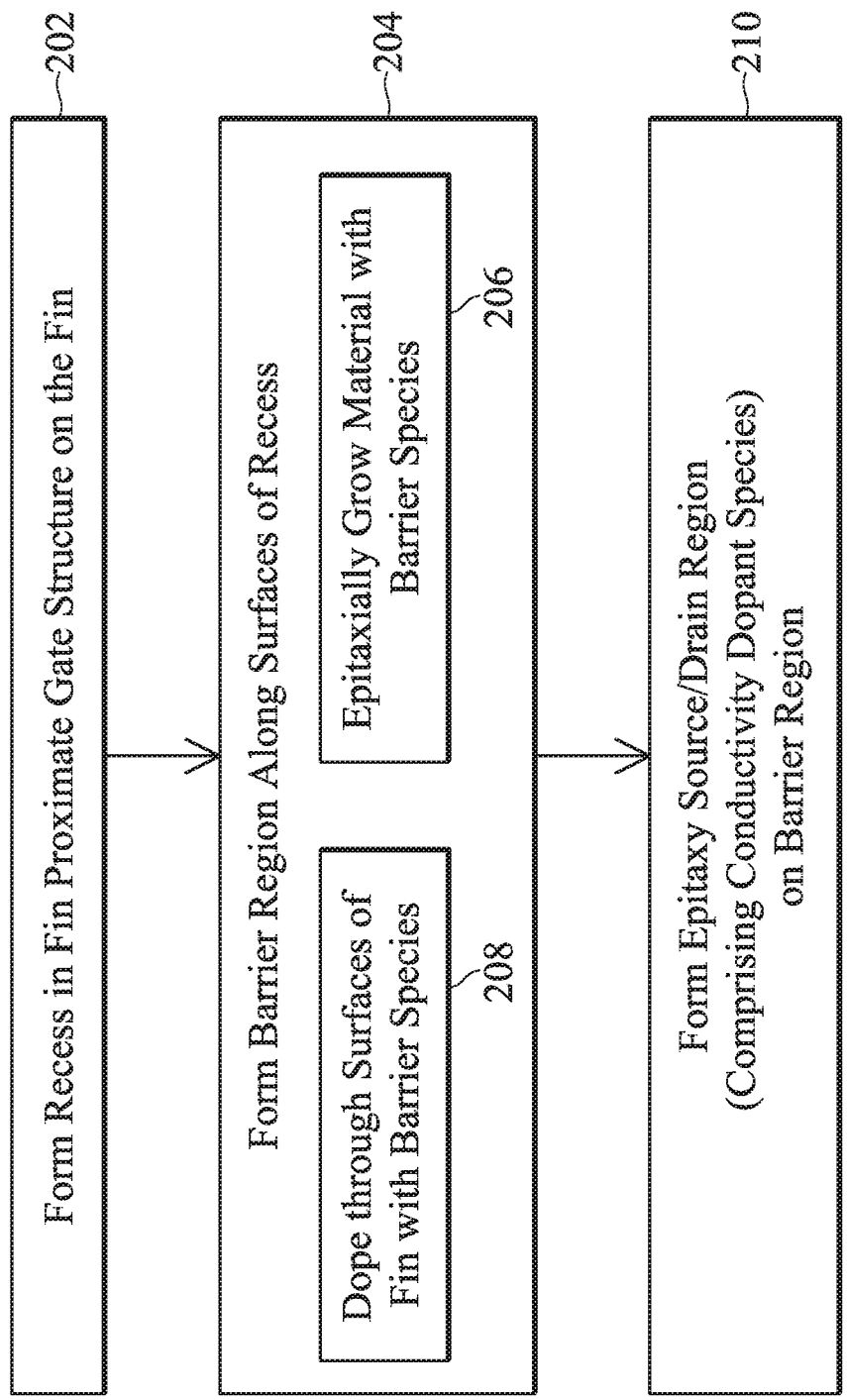
FIG. 9 is a flow chart illustrating example operations for forming a semiconductor device in accordance with some embodiments.

FIGS. 8A and 8B illustrate the formation of a second ILD 122 and conductive features 120 to the epitaxy source/drain regions 92. The second ILD 122 is deposited, such as by an appropriate deposition process, on top surfaces of the first ILD 100, replacement gate structures, and CESL 96. The second ILD 122 may comprise or be silicon dioxide, a low-k dielectric material, silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. Openings can then be formed through the second ILD 122, first ILD 100, and CESL 96 to expose respective epitaxy source/drain regions 92, such as by using appropriate photolithography and etch processes.

Conductive features 120 are then formed in the openings to the epitaxy source/drain regions 92. The conductive features 120 can include a conformal adhesion and/or barrier layer along sidewalls of the opening (e.g., sidewalls of the first ILD 100 and second ILD 122) and a conductive fill material on the adhesion and/or barrier layer to fill the openings. The adhesion and/or barrier layer may be or comprise, for example, titanium, cobalt, nickel, titanium nitride, titanium oxide, tantalum nitride, tantalum oxide, the like or a combination thereof. The conductive fill material may be or comprise tungsten, copper, aluminum, gold, silver, alloys thereof, the like. Silicide regions may also be formed on upper portions of the epitaxy source/drain regions 92. The silicide regions may be formed by reacting upper portions of the epitaxy source/drain regions 92 with the adhesion and/or barrier layer. An anneal can be performed to facilitate the reaction of the epitaxy source/drain regions 92 with the adhesion and/or barrier layer. After the conductive fill material for the conductive features 120 is deposited, excess material may be removed by using a planarization process, such as a CMP, to form top surfaces of the conductive features 120 coplanar with the top surface of the second ILD 122. The conductive features may be referred to as contacts, plugs, etc.

FIG. 10 is a cross-sectional view of a portion of the intermediate structure of FIG. 7A to illustrate further details in accordance with aspects of the present disclosure. Although different materials and/or species may be implemented, in this example, the fin 74 is silicon, the barrier region 91 is an arsenic doped silicon (Si:As) region or an epitaxial silicon arsenic (SiAs) layer, and the epitaxy source/drain region 92 is an in situ doped SiP region. As illustrated, a distance d is between a nearest surface of the barrier region 91 and a plane of a sidewall of the replacement gate structure. In some examples, the distance d is equal to or less than about 10 nm, such as in range from 3 nm to 10 nm. FIG. 10 also illustrates reference arrow 300 that begins in the epitaxy source/drain region 92 and traverses through the barrier region 91 into the fin 74. The reference arrow 300 illustrates a reference location for FIG. 11. The reference arrow could be at different locations that traverse the same regions and/or materials.

FIG. 11 is a graph 400 illustrating various dopant profiles along the reference arrow 300 in FIG. 10 in accordance with aspects of the present disclosure. The graph 400 illustrates concentration of dopants as a function of position along the reference arrow 300. The graph 400 illustrates a first pre-anneal profile 402a of phosphorous, a second pre-anneal profile 404a of arsenic, a first post-anneal profile 402b of phosphorous, a second post-anneal profile 404b of arsenic. The pre-anneal profiles 402a, 404a can be the respective profiles immediately following the epitaxial growth of the epitaxy source/drain region 92, and the anneal referenced by the post-anneal profiles 402b, 404b can be any anneal after the epitaxial growth of the epitaxy source/drain region 92, such as the anneal implemented to form a silicide region on the epitaxy source/drain region 92.

Arsenic is generally less soluble in silicon than phosphorous at most processing temperatures that may be encountered during formation of an IC. For example, arsenic doped in silicon to a concentration of about $10^{21}$ $cm^{-3}$ can have a diffusivity of about $8 \times 10^{-16}$ $cm^2/s$ at a temperature of about 800° C., while phosphorous doped in silicon to a concentration of about $10^{21}$ cm$^{-3}$ can have a diffusivity of about $6 \times 10^{-14}$ cm$^2$/s at a temperature of about 800° C. It is believed that the larger size (radius of about 119 picometers) and atomic weight (about 74.9 amu) of arsenic contributes to the lower solubility and diffusivity in silicon compared to phosphorous, which has a radius of about 100 picometers and atomic weight of about 31 amu. Further, it is believed that these attributes of arsenic permit arsenic to reduce or prevent out-diffusion of phosphorous into silicon.

In the graph 400 of FIG. 11, the decrease in concentration of arsenic remains substantially unchanged between the second pre-anneal and post-anneal profiles 404a, 404b from the interface between the barrier region 91 and the fin 74 into the fin 74. The substantially unchanged decrease in concentration of arsenic can be due to the low diffusivity and low solubility of arsenic in silicon as described above. The decrease in the second pre-anneal and post-anneal profiles 404a, 404b can have a slope m1 in a range from about 0.1 decades/nm to about 0.3 decades/nm. The second pre-anneal and post-anneal profiles 404a, 404b further illustrate some diffusion of arsenic from the interface between the barrier region 91 and the epitaxy source/drain region 92 into the epitaxy source/drain region 92. The incorporation of phosphorous into the epitaxy source/drain region 92 can permit more diffusion of arsenic into the epitaxy source/drain region 92.

The first pre-anneal and post-anneal profiles 402a, 402b illustrate some diffusion of phosphorous across the barrier region 91 and into the fin 74; however, after the anneal (e.g., in the first and second post-anneal profiles 402b, 404b), the concentration of phosphorous in the fin 74 at any location where the concentration of phosphorous is within 3 decades of the concentration of phosphorous at the interface between the barrier region 91 and the epitaxy source/drain region 92 is less than the concentration of arsenic in the fin 74 at that respective location. Further, the decrease in concentration of phosphorus in the first post-anneal profile 402b from the interface between the barrier region 91 and the fin 74 into the fin 74 is greater than the decrease in concentration of arsenic in the second post-anneal profile 404b from the interface between the barrier region 91 and the fin 74 into the fin 74. The decrease in the first post-anneal profile 402b can have a slope m2 in a range from about 0.1 decades/nm to about 0.3 decades/nm. The magnitude of the slope m2 is greater than the magnitude of the slope m1, as illustrated.

The inventors have observed that arsenic can block diffusion of phosphorus into silicon (e.g., such that an instantaneous concentration of arsenic is greater than the corresponding concentration of phosphorous) when the barrier region 91 has a concentration of arsenic that is about $10^{18}$ cm$^{-3}$ or greater. Hence, in some examples, the barrier region 91 has a concentration of arsenic that is about $10^{18}$ cm$^{-3}$ or greater, such as in a range from about $1 \times 10^{20}$ cm$^{-3}$ to about $2 \times 10^{21}$ cm$^{-3}$.

Further, since the concentration of arsenic in the second pre-anneal and post-anneal profiles 404a, 404b remain substantially unchanged in the fin 74, the barrier region 91 can substantially retain the same concentration profile diffused in the fin 74 from the initial formation of the barrier region 91 through subsequent processing. Also, as described above, this concentration profile of arsenic can block diffusion of phosphorous in the fin 74. These aspects can permit more precise placement of the source/drain region (e.g., including the barrier region 91 and the epitaxy source/drain region 92). Assuming relatively precise control of the formation of the barrier region 91, more abrupt decreases (e.g., larger magnitudes of slopes m1 and m2) in dopant profiles can be achieved to form the source/drain region in closer proximity to the channel. Hence, the distance d in FIG. 10 can be decreased.

Further, diffusion of conductivity dopant species, like phosphorous, may be blocked from diffusing into a channel region in the fin 74. This can reduce a risk of DIBL and other challenges. The source/drain region can be more heavily doped with a conductivity dopant species, which can permit a low channel resistance (Rch), reduce parasitic resistance (Rp), and/or improve current, thereby improving device performance.

In an embodiment, a method of manufacturing a semiconductor device is provided. An active area is formed on a substrate. The active area includes a source/drain region. The formation of the source/drain region includes forming a barrier region along a bottom surface and side surface of a recess in the active area. The barrier region includes arsenic having a first dopant concentration. The formation of the source/drain region further includes forming an epitaxial material on the barrier region in the recess. The epitaxial material includes phosphorous having a second dopant concentration.

In another embodiment, a structure is provided. The structure generally includes an active region of a transistor. The active region includes a source/drain region. The source/drain region includes a barrier region along a bottom surface and side surface of the source/drain region. The barrier region includes arsenic having a first dopant concentration. The source/drain region further includes an epitaxial material disposed on the barrier region. The epitaxial material includes phosphorous having a second dopant concentration. The structure further includes a gate structure over the active region proximate the source/drain region.

In another embodiment, another method is provided. The method includes etching a recess in a fin proximate a gate structure. The gate structure is on the fin on a substrate. The method includes forming a barrier region along a bottom surface and side surface of the recess. The barrier region includes arsenic. The method includes epitaxially growing an epitaxial material on the barrier region. The epitaxial material includes phosphorous.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of manufacturing a semiconductor device, the method comprising:
  forming an active area on a substrate, the active area including a source/drain region, wherein forming the active area comprises:
    forming a barrier region along a bottom surface and side surface of a recess in the active area, the barrier region comprising arsenic having a first dopant concentration; and forming an epitaxial material on the barrier region in the recess, the epitaxial material comprising phosphorous having a second dopant concentration.

2. The method of claim 1, wherein forming the barrier region comprises epitaxially growing the barrier region, the barrier region being in situ doped with the arsenic during the epitaxial growth.

3. The method of claim 1, wherein forming the barrier region comprises plasma doping the active area through the bottom surface and side surface of the recess with the arsenic.

4. The method of claim 1, wherein forming the barrier region comprises epitaxially growing the barrier region using a chemical vapor deposition (CVD) process, the barrier region being a SiAs layer.

5. The method of claim 1, wherein the active area comprises a fin, and the semiconductor device is a n-channel Fin Field Effect Transistor (FinFET).

6. The method of claim 1, wherein the first dopant concentration is in a range from about $1\times10^{20}$ cm$^{-3}$ to about $2\times10^{21}$ cm$^{-3}$.

7. The method of claim 1, wherein a thickness of the barrier region is in a range from about 1 nanometer to about 20 nanometers.

8. The method of claim 1 further comprising forming a gate structure over the active area, a sidewall of the gate structure most laterally proximate the source/drain region defining a plane, wherein a surface of the epitaxial material is less than 10 nm from the plane.

9. A method of manufacturing a semiconductor device, the method comprising:
etching a recess in a fin proximate a gate structure, the gate structure being on the fin on a substrate;
forming a barrier region along a bottom surface and side surface of the recess, the barrier region comprising arsenic; and
epitaxially growing an epitaxial material on the barrier region, the epitaxial material comprising phosphorous.

10. The method of claim 9, wherein forming the barrier region comprises:
epitaxially growing the barrier region in the recess.

11. The method of claim 10, wherein epitaxially growing the barrier region comprises performing a chemical vapor deposition (CVD) process to grow a SiAs epitaxial layer as the barrier region.

12. The method of claim 9, wherein forming the barrier region comprises doping the bottom surface and side surface of the recess with the arsenic.

13. The method of claim 9, wherein forming the barrier region comprises plasma doping the bottom surface and side surface of the recess with the arsenic.

14. The method of claim 9, wherein a dopant concentration of the arsenic in the barrier region is in a range from $1\times10^{20}$ cm$^{-3}$ to $2\times10^{21}$ cm$^{-3}$.

15. The method of claim 9, wherein a thickness of the barrier region is in a range from 1 nanometer to 20 nanometers.

16. A method of manufacturing a semiconductor device, the method comprising:
forming a first gate structure over a first semiconductor fin;
forming a first recess and a second recess in the first semiconductor fin on opposing sides of the first gate structure;
forming a barrier region along a bottom surface and side surface of the first recess and the second recess, the barrier region comprising arsenic; and
epitaxially growing an epitaxial material on the barrier region, the epitaxial material comprising an n-type dopant.

17. The method of claim 16, wherein the n-type dopant comprises phosphorous.

18. The method of claim 16, wherein forming the barrier region comprises a plasma doping process.

19. The method of claim 16, wherein forming the barrier region comprises epitaxially growing the barrier region.

20. The method of claim 16, wherein a dopant concentration of the arsenic in the barrier region is in a range from $1\times10^{20}$ cm$^{-3}$ to $2\times10^{21}$ cm$^{-3}$.

* * * * *